(12) United States Patent
Hayashi (10) Patent No.: US 6,458,697 B2
(45) Date of Patent: Oct. 1, 2002

(54) SEMICONDUCTOR DEVICE AND MANUFACTURING METHOD THEREFOR

(75) Inventor: Tetsuya Hayashi, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/829,555

(22) Filed: Apr. 10, 2001

(30) Foreign Application Priority Data

Apr. 13, 2000 (JP) ........................................ 2000-111976

(51) Int. Cl.$^7$ ........................ H01L 21/44; H01L 21/4763
(52) U.S. Cl. ..................... 438/672; 438/622; 438/629; 438/637; 438/675; 438/685
(58) Field of Search .................... 438/622, 672, 438/637, 639, 675, 653, 668, 666, 669, 685, 629

(56) References Cited

U.S. PATENT DOCUMENTS 5,747,379 A * 5/1998 Huang et al. ............... 438/586
6,191,025 B1 * 2/2001 Liu et al. .................... 438/622
6,191,027 B1 * 2/2001 Omura ........................ 438/627

FOREIGN PATENT DOCUMENTS

| JP | 4-372157 | 12/1992 |
| JP | 5-304216 | 11/1993 |

* cited by examiner

Primary Examiner—Steven Loke
Assistant Examiner—Shouxiang Hu
(74) Attorney, Agent, or Firm—Dickstein, Shapiro, Morin & Oshinsky, L.L.P.

(57) ABSTRACT

A plug material is filled inside a lower via hole formed in a lower interlayer insulating film, thereby to create a void inside the lower via hole. The void is filled with a filling material. Even if a film formed on the surface of the lower interlayer insulating film is etched, the void is prevented from being expanded. An upper interlayer insulating film is formed on the lower interlayer insulating film. The upper interlayer insulating film is etched so as to form an upper via hole in an area just above the lower vial hole. As a result of this etching, the filling material is removed, so that the void can not be expanded. After this, predetermined upper wiring, etc. is formed, thus completing a semiconductor device.

9 Claims, 5 Drawing Sheets

SEMICONDUCTOR DEVICE AND MANUFACTURING METHOD THEREFOR

BACKGROUND OF THE INVENTION

1. Field of the Invention

The present invention. relates to a semiconductor device and a method for manufacturing the same. Particularly, the present invention relates to a semiconductor device having the multi-layer wiring structure, wherein a plurality of wiring layers are deposited on top of another, through an interlayer insulating film, and a method for manufacturing the same.

2. Description of the Related Art

Every year, along with the miniaturization of integrated circuits included in semiconductor devices, the integration degree of such integrated circuits has been increased. To realize the high integration of the integrated circuits, the multi-layer wiring structure including a plurality of wiring layers formed on top of another is employed. The plurality of wiring layers are deposited on top of another through an interlayer insulating film, and connected with each other through a via hole (or a contact hole) formed in the interlayer insulating film.

Figure 3:
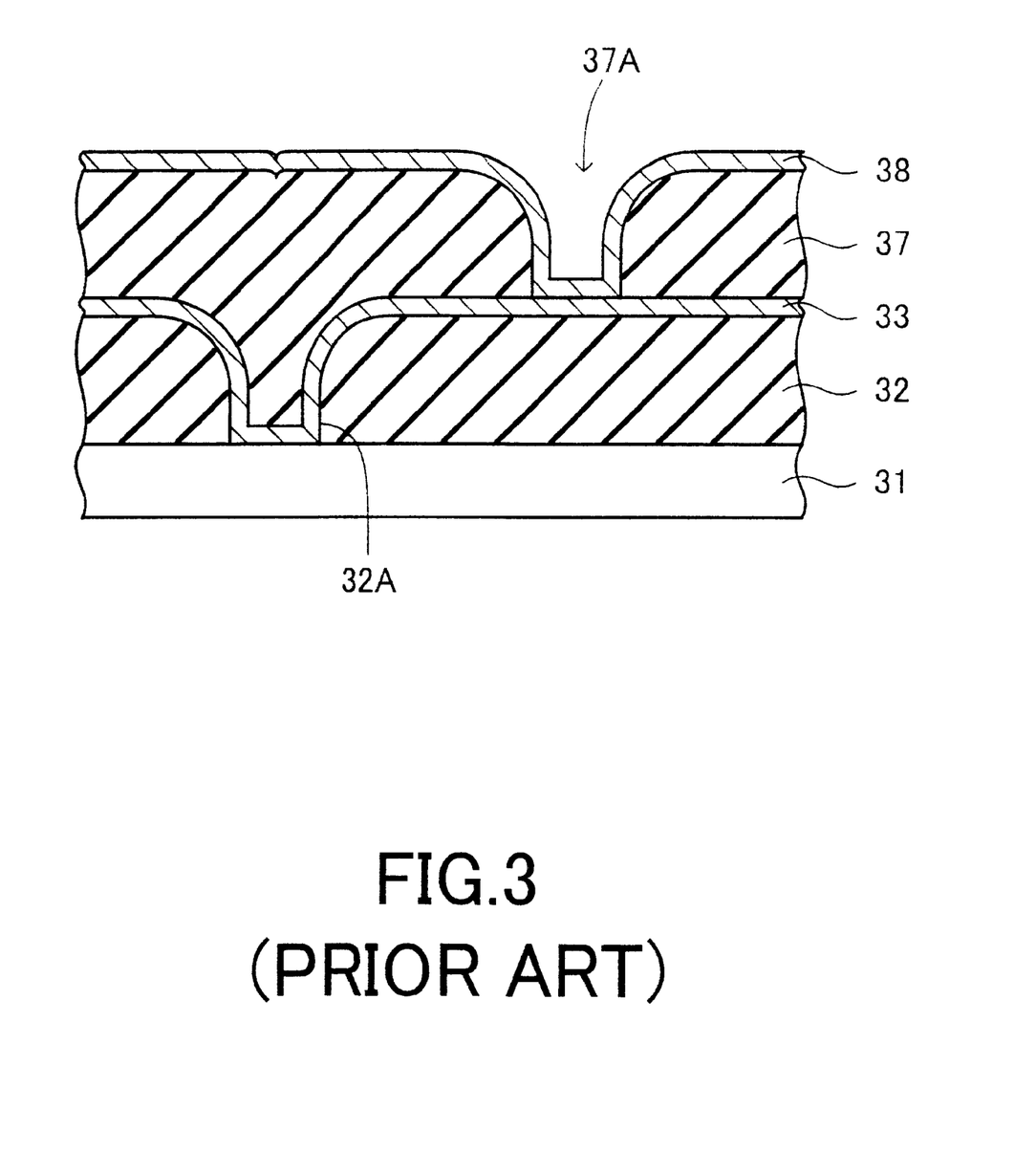
FIG. 3 is a diagram showing the structure of a conventional semiconductor device.

Such a semiconductor device having the multi-layer wiring structure is disclosed in Unexamined Japanese Patent Application KOKAI Publication No. H4-372157. As shown in FIG. 3, in the semiconductor device disclosed in the above publication, a lower interlayer insulating film 32 having a via hole 32A is formed on a substrate 31. A metal film 33 for the lower wiring layer is formed over and throughout the surface of the lower interlayer insulating film 32 and the internal wall and bottom of the via hole 32A. An upper interlayer insulating film 37 having a via hole 37A is formed on the metal film 33. A metal film 38 for the upper wiring is formed over and throughout the surface of the upper interlayer insulating film 37 and the internal wall and bottom of the via hole 37A. The metal film 38 is electrically connected to the metal film 33 through the via hole 37A.

The formation position of the via hole 32A and the formation position of the via hole 37A do not vertically coincide with each other. Hence, it is hard to miniaturize the semiconductor device having the above structure shown in FIG. 3.

If the semiconductor device is made in a miniaturized form, and the integration degree is raised, the aspect ratio of the via hole is set high. In the case where a wiring layer is formed on an interlayer insulating film having a via hole with a high aspect ratio, using a sputtering technique, etc., a void may possibly be created inside the via hole by a shadowing effect.

If the wiring layer is etched while leaving the void inside the via hole, the void is expanded so that a layer (e.g., a substrate) below the interlayer insulating film may unintentionally be etched as well. As a result of this, the semiconductor device can not desirably be operated.

According to a technique disclosed in Unexamined Japanese Patent Application KOKAI Publication No. H5-304216, the via hole is filled with silicon oxide, thereby the semiconductor device is prevented from any effect of the void.

Figure 4:
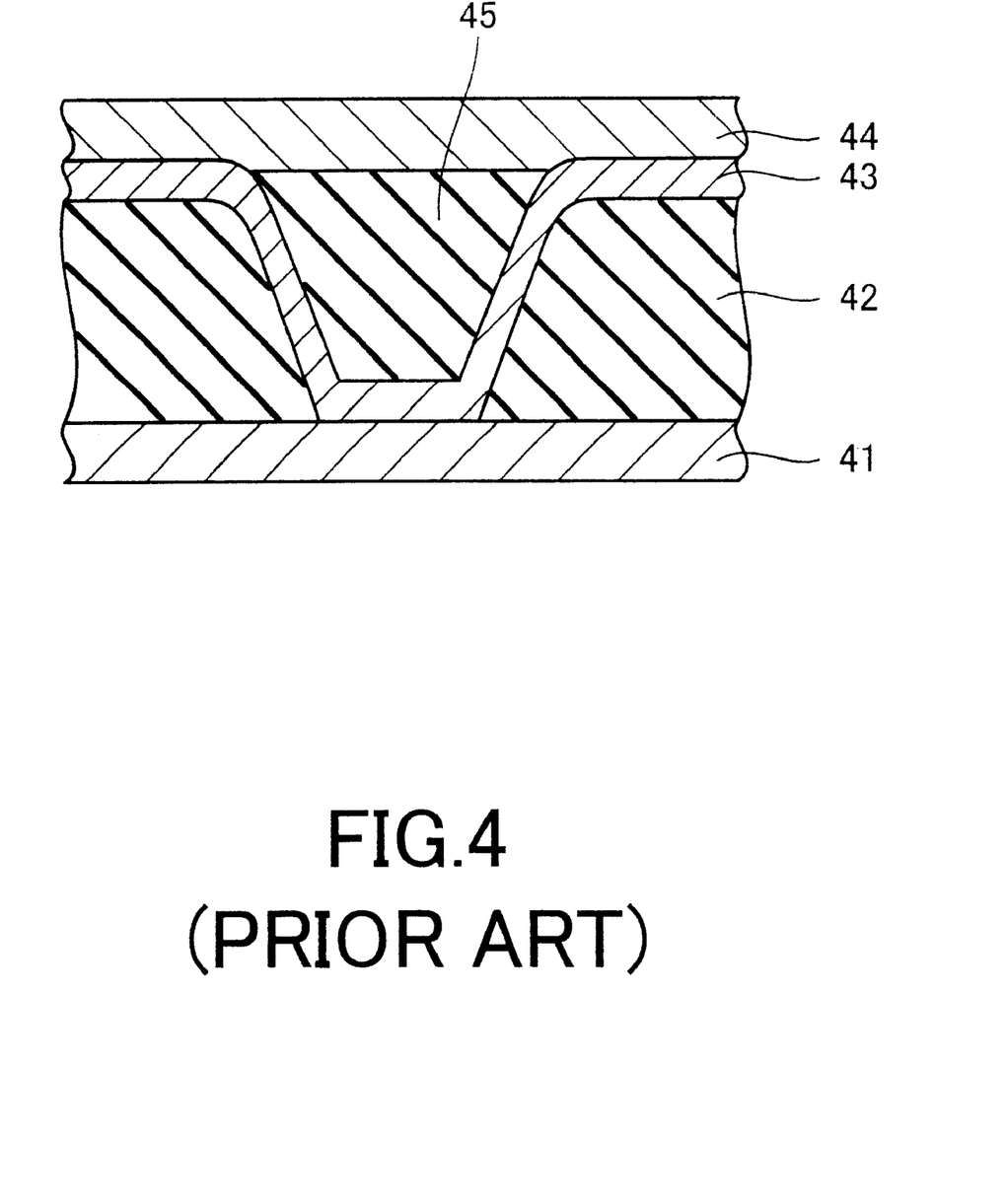
FIG. 4 is a diagram showing the structure of another conventional semiconductor device.

Particularly, as illustrated in FIG. 4, an interlayer insulating film 42 is formed on a lower wiring layer 41. A metal film 43 is formed, using a sputtering technique, on the interlayer insulating film 42 and inside the via hole which is formed in a predetermined position of the interlayer insulating film 42. The via hole is filled with silicon oxide 45, after the formation of the metal film 43. The upper wiring layer 44 is formed on the metal layer 43 and the silicon oxide 45, using a sputtering technique. In this structure, the upper wiring layer 44 is electrically connected to the lower wiring layer 41 through the metal film 43.

As shown in FIG. 4, in the structure the via hole is mostly filled with the silicon oxide 45, a problem is that the resistance between the lower wiring layer 41 and the metal film 43 through the via hole is high.

In the case where another via hole is formed just above the via hole of the interlayer insulating film 42, the upper wiring layer 44 may be over-etched. Hence, the semiconductor device can not desirably be operated.

The entire contents of Unexamined Japanese Patent Application KOKAI Publications Nos.H4-372157: and H5-304216 are herein incorporated in this specification.

SUMMARY OF THE INVENTION

It is accordingly an object of the present invention to provide a semiconductor device having high operational reliability and a manufacturing method therefor.

Another object thereof is to provide a semiconductor device which gets no effect of a void created inside a via hole.

Still another object thereof is to provide a method for manufacturing a semiconductor device which is prevented from getting any effect of a void created inside a via hole.

In order to achieve the above objects, according to the first aspect of the present invention, there is provided a method for manufacturing a semiconductor device having at least two via holes which vertically meet each other, the method comprising:

forming a first via hole in a first interlayer insulating film;

forming a barrier metal on a surface of the first interlayer insulating film and a side wall and bottom of the first via hole;

filling the first via hole with a first conductive material, by depositing the first conductive material on the barrier metal;

filling, with a filling material, a void, which is formed inside the first via hole by filling the via hole with the first conductive material;

etching a barrier metal which is formed on the surface of the first interlayer insulating film;

forming a second interlayer insulating film on the first interlayer insulating film;

forming a second via hole and removing the filling material from the void, by etching an area above the first via hole of the second interlayer insulating film; and filling the second via hole and the void with a second conductive material.

According to this invention, a semiconductor device which does not get any effect from the void which is created inside the via hole can be manufactured. As a result of this, it is possible to provide a semiconductor device having high operational reliability.

The filling the void with the filling material may include using the filling material having fluidity.

The filling the void with the filling material may include filling the void with the filling material using an SOG (Spin On Glass) technique.

The filling the void with the filling material may include using the filling material including a substance which is not substantially etched by a substance for etching the barrier metal.

The filling the void with the filling material may include filling the void with the filling material and forming a reflection preventing film, on the barrier metal, for etching a predetermined area of the barrier metal, by depositing the filling material on the barrier metal and the conductive material which is filled in the first via hole.

The filling the void with the filling material may include depositing SiON inside the void, as the filling material, using a plasma CVD (Chemical Vapor Deposition) technique.

The depositing the SiON may include depositing the SiON in such a manner that a thickness of the reflection preventing film is in a range from 30 to 100 nm.

The forming the barrier meal may include forming a Ti film over and throughout the surface of the first interlayer insulating film and the side wall and bottom of the first via hole, and forming a TiN film on the Ti film;

the filling the void with the filling material includes using the filling material including a silicon oxide; and the etching the barrier metal may include etching the barrier metal with a chloric gas.

In order to achieve the above objects, according to the second aspect of the present invention, there is provided a semiconductor device having at least two via holes which vertically meet each other, the device comprising:

a first interlayer insulating film which includes a first via hole;

a second interlayer insulating film which is formed on the first interlayer insulating film and includes a second via hole in an area above the first via hole;

a first conductive material which is deposited inside the first via hole; and a second conductive material which is deposited inside a void, created when depositing the first conductive material, and the second via hole.

The first via hole may have a diameter in a range from 0.28 to 0.32 µm.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

A method, for manufacturing a semiconductor device, according to the first embodiment of the present invention will now be explained with reference to the accompanying drawings.

A semiconductor device which is manufactured in accordance with the manufacturing method according to the first embodiment has at least two via holes which vertically meet each other. FIGS. 1A to 1H are diagrams each showing a process included in the manufacturing method of the first embodiment.

Figure 1A:
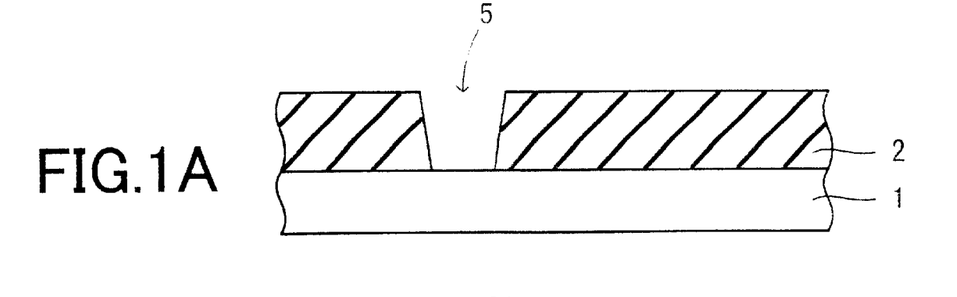
FIGS. 1A to 1H are diagrams each showing the structure of a semiconductor device in a process included in a manufacturing method according to the first embodiment.

As illustrated in FIG. 1A, a lower interlayer insulating film 2 is formed on a silicon substrate 1, using, for example, a CVD (Chemical Vapor Deposition) technique. The lower interlayer insulating film 2 is formed of a composition of $SiO_2$, or BPSG (Boro-Phospho Silicate Glass), or a multi-layer film of the two. The thickness of the lower interlayer insulating film 2 is generally in a range between 600 and 1000 nm, and preferably in a range between 600 and 800 nm.

A lower via hole 5 which gets narrower in deeper portions is formed in a predetermined position of the lower interlayer insulating film 2, as shown in FIG. 1A.

An opening diameter of a via hole depends on the integration degree or density of an integration circuit included in a semiconductor device. The manufacturing method of the present invention can be employed for manufacturing a semiconductor device with an integrated circuit having an extremely-narrow via hole whose opening diameter is less than 0.40 µm, particularly in a range between 0.28 to 0.32 µm. A diameter of the bottom of the via hole depends on the thickness of the interlayer insulating film, and is generally in a range between 0.22 to 0.28 µm.

An opening diameter and bottom diameter of the via hole 5 are sent in the above range. The size of such diameters includes a margin which is calculated in consideration of a position deviation of a via, hole to be lay on top of the via hole 5. This reliably achieves the via hole to be lay on top of the via hole 5.

Figure 1B:
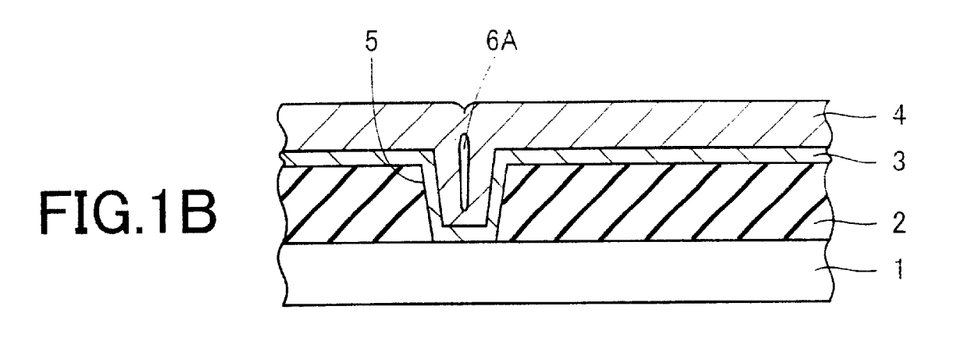

After the lower via hole 5 is thus formed, a barrier metal 3 is formed over and throughout the surface of the lower interlayer insulating film 2, the side wall and bottom of the lower via hole 5, using, for example, a sputtering technique, as shown in FIG. 1B. The barrier metal 3 is composed of a Ti film having a thickness in a range between 20 and 40 nm and a TiN film formed on the Ti film and having a thickness in a range between 40 and 70 nm.

A plug material 4 (e.g., W (tungsten)) is deposited over the barrier metal 3 to fill up the lower via hole 5, using a plasma CVD technique. Particularly, the plug material 4 is put on the barrier metal 3 above the substrate 1 which is set at a temperature of 400° C., by a reduction reaction ($WF_6$+ $SiH_4 \rightarrow W+SiF_4+4HF$) of a source gas ($WF_6$) and silane ($SiH_4$) or hydrogen ($H_2$).

Since the lower via hole 5 is made narrow, a void 6A is created inside the plug material 4, as a result of a shadowing effect, etc., as illustrated in FIG. 1B. The width of the void 6A is in a range between 0.02 and 0.07 µm.

Figure 1C:
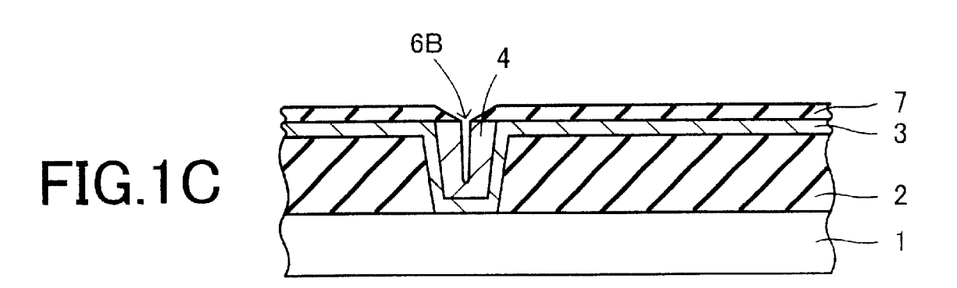

A portion of the plug material 4 which is formed except inside the lower via hole 5 is etched back so as to be removed therefrom, as shown in FIG. 1C. Then, the void 6A appears as a void 6B.

The plug material 4 which remains inside the via hole 5 serves as a part of a plug for connecting the circuit on the substrate 1 and upper wiring.

The TiN film 7 is formed, using the sputtering technique, on the barrier metal 3, which appears as a result of the etching back of the portion of the plug material 4, and on the plug material 4, as shown in FIG. 1C. The thickness of the TiN film 7 is in a range between 20 and 40 nm. In the case where the barrier metal 3 is used as wiring, the TiN film 7 is formed for adjusting the resistance of the wiring.

After this, a process for filling the void 6B, which is the distinctive feature of the present invention, is performed.

Specifically, a filling material 8, such as an organic silicon liquid, is applied onto the TiN film 7, using an SOG (Spin On Glass) technique. Accordingly, the liquid filling material 8 is thus used,. thereby to fill the extremely-narrow void 6B with the filling material 8.

For example, the organic silicon liquid is methyl silicone varnish, which is a copolymer composed of $SiO_2$, $CH_3SiO_{3/2}$, $(CH_3)_2SiO$, $(CH_3)_3SiO_{3/2}$, etc., phenyl methyl silicone varnish, which is a copolymer composed of $CH_3SiO_{3/2}$, $(CH_3)_2SiO$, $C_6H_5SiO_{3/2}$, $(C_6H_5)(CH_3)SiO$, and $(C_6H_5)_2SiO$, etc., or denatured silicone varnish, etc.

The applied filling material 8 gets harder by being annealed at a temperature, for example, 400° C. for 10 to 20 minutes.

Figure 1D:
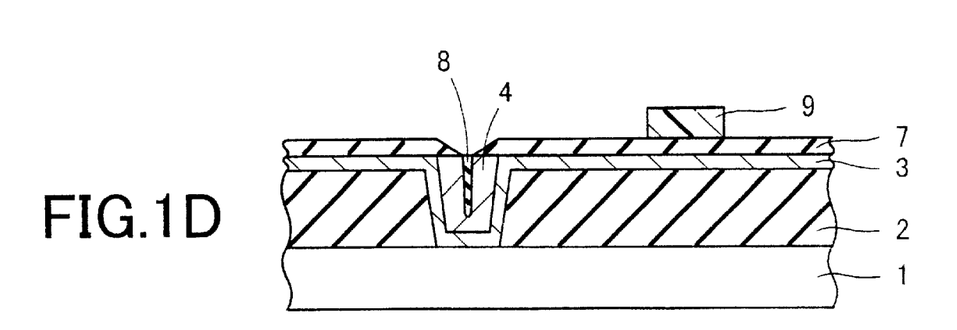

A portion of the filling material 8 which is formed except inside the void 6B is etched back so as to be removed therefrom. Having performed this, the void 6B is filled with the filling material 8, as illustrated in FIG. 1D.

Upon completion of such a filling process, a photoresist is applied onto the TiN film 7, which appears as a result of the etching back of the filling material 8, and on the filling material 8. As illustrated in FIG. 1D, a mask 9 is formed in a predetermined area of the TiN film 7, by exposing and developing the photoresist. The mask 9 is used for etching a predetermined portion of the barrier metal 3 and TiN film 7.

Figure 1E:
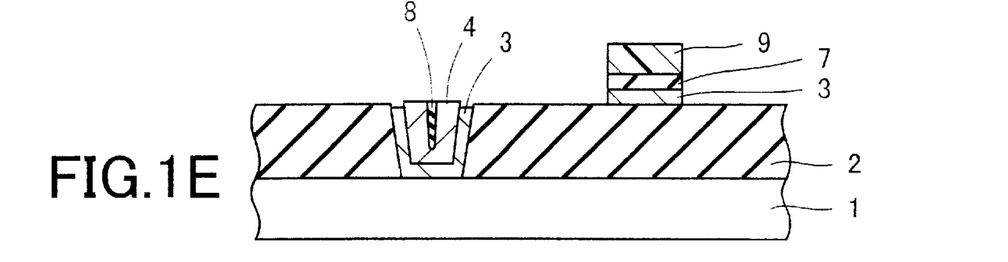

As shown in FIG. 1E, the barrier metal 3 and the TiN film 7 are etched, except the predetermined portion where the mask 9 is formed, so as to be removed therefrom, using a gas such as $Cl_2$, $BCl_3$, etc. At this time, the filling material 8 including a silicon oxide is hardly etched. Hence, unlike conventional cases, the void 6B is not expanded.

Figure 1F:
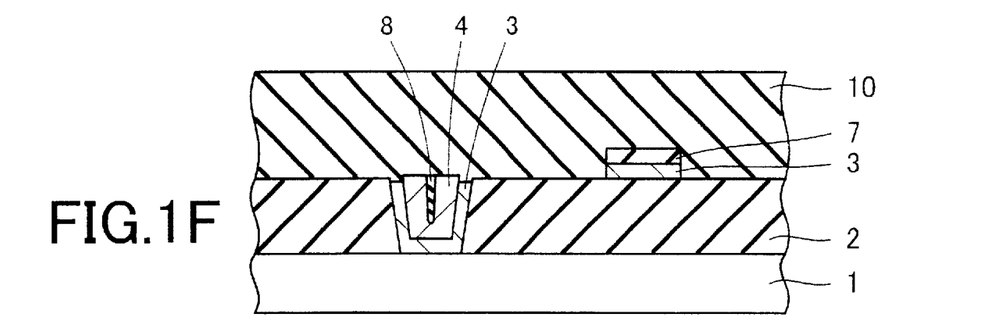

After the mask is removed, as illustrated in FIG. 1F, an upper interlayer insulating film 10 is formed above the lower interlayer insulating film 2, the barrier metal 3, the plug material 4, the TiN film 7, and the filling material 8, using the CVD technique. The surface of the upper interlayer insulating film 10 gets flatter using a CMP (Chemical Mechanical Polishing) technique. The upper interlayer insulating film 10 is formed of the same material(s) as that of the lower interlayer insulating film 2.

Figure 1G:
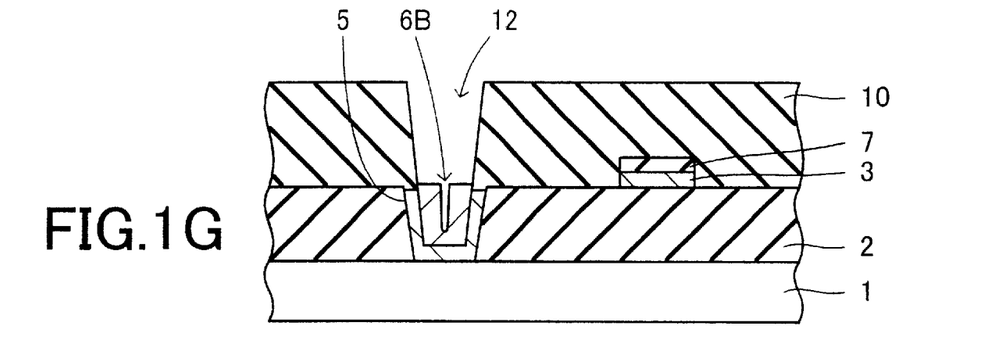

An upper via hole 12, which is in a taper-like shape so as to get narrower in width in deeper portions, is formed in an area of the upper interlayer insulating film 10 which is just above the lower via hole 5, using an etching technique, etc., as shown in FIG. 1G.

At this time, even if the upper via hole 12 is formed using a reactive ion etching technique, for example, the void 6B can not be expanded unlike the conventional cases. It is because the void 6B is filled with the filling material 8 in accordance with the above filling process. Thus, the filling material 8 is etched, but the void 6B is not expanded in size. Note that, as an etching gas for performing the reactive ion etching, a gas of $CF_4$, $CHF_3$, or $C_2F_6$, etc., which is mixed with $O_2$ or Ar, is used.

An AR (Anti-Reflection) coat (reflection preventing film) 11 is formed over and throughout the plug material 4, the side wall of the void 6B, the upper interlayer insulating film 10, and the internal wall of the upper via hole 12. The AR coat 11 is used when patterning a film formed on the AR coat 11, and formed of silicon nitride, for example.

Figure 1H:
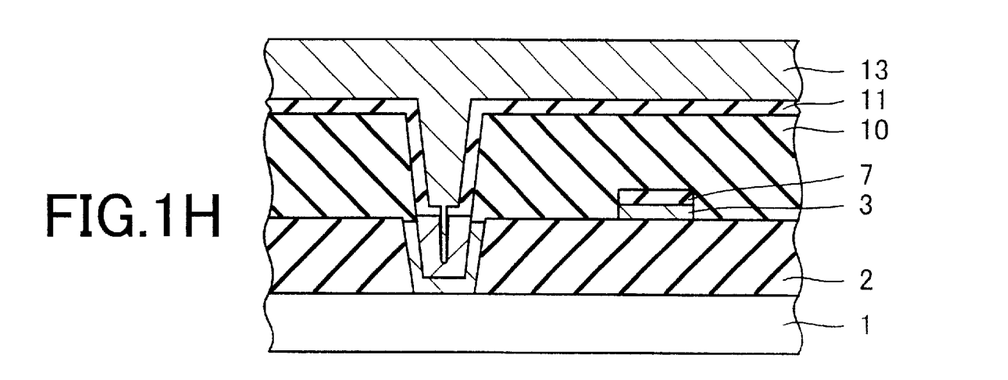

A metal film 13 is formed above the AR coat 11 using the CVD technique, for example, as shown in FIG. 1H. The metal film 13 is etched into a predetermined pattern, and used as wiring. After this, upper wiring connected to the substrate 1 through the lower and upper via holes 5 and 12, which vertically meet each other, is formed.

As explained above, the void 6A (the void 6B) created inside the lower via hole 5 is filled with the filling material 8, thereby avoiding the expansion of the void 6B as caused by the etching process, etc. Because the liquid filling material 8 is used, the extremely-narrow void 6B can reliably be filled with the filling material. Since the filling material 8 is removed when forming the upper via hole 12, the resistance inside the via hole can be prevented from increasing by an effect of the filling material 8. This realizes the manufacture of a semiconductor device whose operational reliability is high.

A method, for manufacturing a semiconductor device, according to the second embodiment will now be explained with reference to the accompanying drawings.

The method according to the second embodiment is performed in the same way as the method according to ,the first embodiment, up to the process for forming the TiN film 7 in the state of FIG. 1C.

Figure 2A:
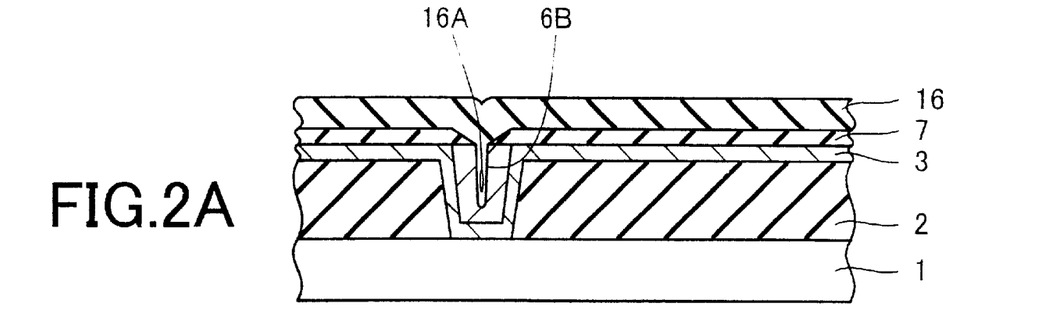
FIGS. 2A to 2D are diagrams each showing the structure of a semiconductor device in a process included in a manufacturing method according to the second embodiment.

After the TiN film 7 is thus formed, an insulating material 16 such as SiON, etc. is deposited on the TiN film 7 and inside the void 6B, as shown in FIG. 2A, using a plasma CVD technique, for example.

The insulting material 16 prevents the expansion of the void 6B, when etching the barrier metal 3 and the TiN film 7. The insulating material 16 which is deposited on the TiN 7 is also used as a reflection preventing film in a process for etching a predetermined area of the barrier metal 3 and the TiN film 7. The insulating material 16 is generally deposited into a thickness between 100 and 200 nm, but is deposited into a thickness between 30 and 100 nm when the insulating material 16 is used as the reflection preventing film.

It is not necessary that the void 6B is fully filled with the insulating material 16, as long as the void 6B is sufficiently filled therewith to prevent the expansion of the void 6B, as shown in FIG. 2A. In other words, a small void 16A may be formed inside the void 6B, as shown in FIG. 2A.

Figure 2B:
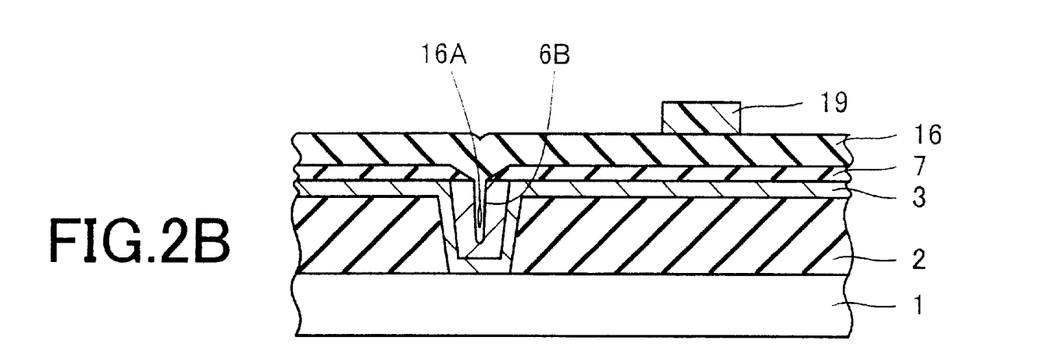

Likewise the first embodiment, a photoresist is applied onto the insulating material 16 deposited on the TiN film 7. A process for exposing the photoresist to light and a process for developing the photoresist are performed, thereby to form a mask 19 in a predetermined area of the insulating material 16, as illustrated in FIG. 2B. At this time, the insulating material 16 which is deposited on the TiN film 7 serves as a reflection preventing film. Therefore, the mask 19 with the accurate size can be formed. The mask 19 is used for etching a predetermined portion of the barrier metal 3, TIN film 7, and insulating material 16.

Figure 2C:
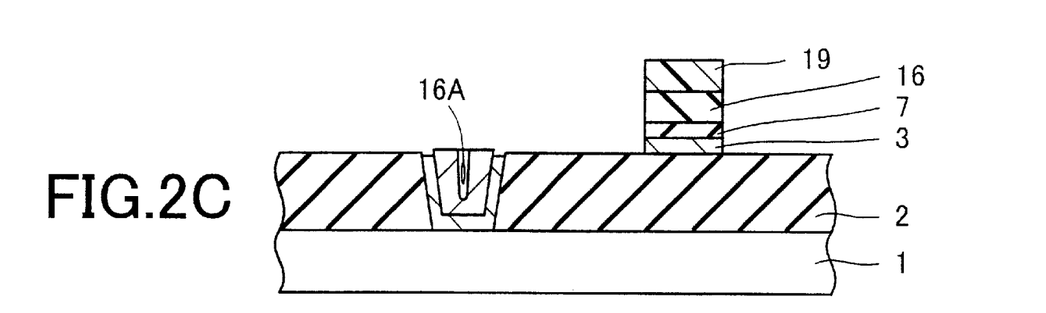

The barrier metal 3, the TiN film 7, and the insulating material 16 are etched, so that their corresponding portions excluding the area, where the mask 19 is formed, are removed therefrom, as shown in FIG. 2C.

Specifically, the insulating material 16 is removed using an etching technique with, for example, a $CF_4$ gas. At this time, the etching should be accomplished without removing the insulating material 16 inside the void 6B.

The barrier metal 3 and the TiN film 7 are etched with a gas, such as $Cl_2$ or $BCl_3$, so as to be removed therefrom. The insulating material 16 including a silicon oxide can hardly be etched with a gas, such as $Cl_2$, $BCl_3$, etc. Hence, the insulating material 16 inside the void 6B can hardly be etched, when etching the barrier metal 3 and the TiN film 7.

In these circumstances, the void 6B can not be expanded by being etched, unlike the conventional techniques.

Figure 2D:
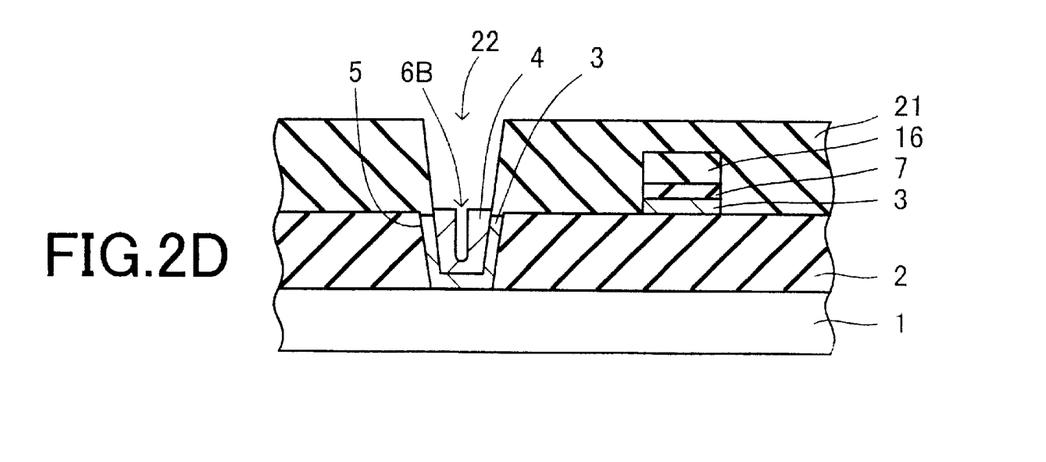

After the mask 19 is removed, like the first embodiment, the upper interlayer insulating film 21 is formed over and throughout the lower interlayer insulating film 2, the barrier metal, 3 the plug material 4, and the insulating material 16, using the CVD technique, for example. The surface of the upper interlayer insulating film 21 gets flatter using the CMP technique.

Thereafter, likewise the first embodiment, an upper via hole 22 which is in a taper-like shape so as to get narrower in deeper portions is formed in an area of the upper interlayer insulating film 21 which is just above the lower via hole 5, as illustrated in FIG. 2D.

When forming the upper via hole 22, the insulating material 16 is etched, but the void 6B is not expanded. Hence, the void 6B is not expanded, unlike the conventional techniques.

Now, likewise the first embodiment, the AR coat and the metal film are formed, and the upper wiring connected to the substrate 1 through a plurality of via holes which vertically meet each other is formed.

As described, the void 6A (the void 6B) which is created inside the lower via hole 5 is filled with the insulating material 16, thereby to avoid the expansion of the void 6B by the effect of the etching process, etc. The insulating material 16 which is deposited on the TiN film 7 can be used as a reflection preventing film. There is not need to form another reflection preventing film, thus simplifying the processes for manufacturing the semiconductor device. The insulating material 16 is removed when to form the upper via hole 22. This prevents an increase in the resistance inside the via hole as may be caused by the insulating material 16. As a result, it is possible to manufacture a semiconductor device having high operational reliability.

The barrier metal 3 may be formed of TiW, nitride of transition metal, boride, carbide, or silicide, etc., other than TiN and Ti. From the aspects of the adhesion to the lower interlayer insulating film 2, the resistance, the easiness of being formed as a film, the two layers of TiN and Ti. are preferably used as the barrier metal 3.

The plug material 4 may be deposited on the barrier metal 3 using a sputtering technique.

The plug material 4 may be a material other than W. For example, the plug material 4 may be high melting point metal or high melting point metal silicide, etc. The plug material 4 may be formed of a metal, such as Al, Mo, etc. whose resistivity is in a range between $10^{-6}$ and $10^{-5}$ $\Omega$cm, or an alloy (or metal silicide), such as AlCuSi, AlSi, TiSi, MoSi, WSi, PtSi, etc.

The filling material 8 may be deposited in the void 6B using an atmospheric-pressure CVD technique which requires $O_3$ and TEOS (TetraEthylOrethoSilicate; Si $(C_2H_5O)_4$). At this time, at a temperature of 400° C., both $O_3$ and TEOS are used, therefore, the filling material 8 ($SiO_2$) can easily flow into the void 6B. Based on this fact, the void 6B is securely filled with $SiO_2$.

In addition to the above-described organic materials, any inorganic materials may be used as the filling material 8.

The portion of the plug material 4, which is formed in any positions other than the inside of the lower vie hole 5, and the portion of the filling material 8, which is formed in any positions other than the inside of the void 6B, may be removed using the CMP technique, instead of being etched back. Otherwise, the plug material 4 may selectively be made to grow inside the lower via hole 5, and the filling material 8 may selectively be made to grow inside the void 6B. The CMP technique and the selective-growing of the plug material 4 and the filling member 8 may appropriately be combined. The AR coat 11 may be formed on the upper interlayer insulating film 10 before the formation of the via hole 12, so that the AR coat 11 is not formed inside the via hole 12. In this structure, the resistance between the metal film 13 and the substrate 1 can be reduced.

In the above-described first and second embodiments, the explanations have been made to the methods for forming two via holes which vertically meet each other. Even in the case where to form three or more via holes are formed to vertically meet each other, the above-described formation process can be performed, thereby to manufacture a semiconductor device having high operational reliability.

In the case where a void is created inside a via hole which is formed in the uppermost interlayer insulating film in the integrated circuit, the void inside the via hole need not filled with any material, because no film exists above this uppermost interlayer insulating film.

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2000-111976 filed on Apr. 13, 2000, and including specification, claims, drawings and summary. The disclosure of the above Japanese Patent Application is incorporated herein by reference in its entirety.

What is claimed is:

1. A method for manufacturing a semiconductor device having at least two via holes which vertically meet each other, said method comprising:

forming a first via hole in a first interlayer insulating film;

forming a barrier metal on a surface of the first interlayer insulating film and a side wall and bottom of the first via hole;

filling the first via hole with a first conductive material, by depositing the first conductive material on the barrier metal;

filling, with a filling material, a void, which is formed inside the first via hole by filling the via hole with the first conductive material;

etching said barrier metal which is formed on the surface of the first interlayer insulating film;

forming a second interlayer insulating film on the first interlayer insulating film;

forming a second via hole and removing the filling material from the void, by etching an area above the first via hole of the second interlayer insulating film; and filling the second via hole and the void with a second conductive material.

2. The method according to claim 1, wherein said filling the void with the filling material includes using the filling material having fluidity.

3. The method according to claim 2, wherein said filling the void with the filling material includes filling the void with the filling material using an SOG (Spin On Glass) technique.

4. The method according to claim 2, wherein said filling the void with the filling material includes using the filling material including a substance which is not substantially etched by a substance for etching the barrier metal.

5. The method according to claim 4, wherein:

said forming the barrier metal includes
forming a Ti film on the surface of the first interlayer insulating film and the side wall and bottom of the first via hole, and
forming a TiN film on the Ti film;

said filling the void with the filling material includes using the filling material including a silicon oxide; and said etching the barrier metal includes etching the barrier metal with a chloric gas.

6. The method according to claim 1, wherein said filling the void with the filling material includes filling the void with the filling material and forming a reflection preventing film, on the barrier metal, for etching a predetermined area of the barrier metal, by depositing the filling material on the barrier metal and the conductive material which is filled in the first via hole.

7. The method according to claim 6, wherein said filling the void with the filling material includes depositing SiON inside the void, as the filling material, using a plasma CVD (Chemical Vapor Deposition) technique.

8. The method according to claim 7, wherein said depositing the SiON includes depositing the SiON in such a manner that a thickness of the reflection preventing film is in a range from 30 to 100 nm.

9. The method according to claim 6, wherein:

said forming the barrier meal includes
forming a Ti film over and throughout the surface of the first interlayer insulating film and the side wall and bottom of the first via hole, and
forming a TiN film on the Ti film;

said filling the void with the filling material includes using the filling material including a silicon oxide, and said etching the barrier metal includes etching the barrier metal with a chloric gas.

* * * * *